(12) United States Patent
Chung et al.

(10) Patent No.: US 8,039,192 B2
(45) Date of Patent: Oct. 18, 2011

(54) TRANSFER SUBSTRATE, METHOD OF MANUFACTURING THE SAME AND METHOD OF MANUFACTURING AN ORGANIC ELECTROLUMINESCENT ELEMENT

(75) Inventors: Jin-Koo Chung, Suwon-si (KR); Chang-Woong Chu, Suwon-si (KR); Joo-Hyeon Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 295 days.

(21) Appl. No.: 12/395,519

(22) Filed: Feb. 27, 2009

(65) Prior Publication Data

US 2009/0266479 A1 Oct. 29, 2009

(30) Foreign Application Priority Data

Apr. 29, 2008 (KR) .................. 10-2008-0039785

(51) Int. Cl.
*G03C 8/00* (2006.01)
*B14M 5/40* (2006.01)

(52) U.S. Cl. ..... 430/199; 430/200; 430/201; 428/32.63; 428/32.64

(58) Field of Classification Search ............. 430/199, 430/200, 201; 428/32.63, 32.64
See application file for complete search history.

(56) References Cited

U.S. PATENT DOCUMENTS

2008/0113292 A1 * 5/2008 Matsuo .............. 430/270.1

FOREIGN PATENT DOCUMENTS

| JP | 2004-040076 | 2/2004 |
| KR | 2002-0090133 | 11/2002 |
| KR | 10-2005-0115657 | 12/2005 |
| KR | 10-2006-0017424 | 2/2006 |

\* cited by examiner

*Primary Examiner* — Amanda C. Walke
(74) *Attorney, Agent, or Firm* — Innovation Counsel LLP

(57) ABSTRACT

A transfer substrate includes a base layer, a light-reflecting layer pattern, a light-to-heat conversion layer and a transfer layer. The transfer layer is formed on the light-to-heat conversion layer. A line shaped laser beam may be scanned over the entire area of the transfer substrate to transfer designated portions of the transfer layer onto designated electrodes on an array substrate to make an organic electroluminescent display. Thus, processing time may be reduced, and an organic electroluminescent element may be efficiently formed on a large-size substrate.

25 Claims, 9 Drawing Sheets

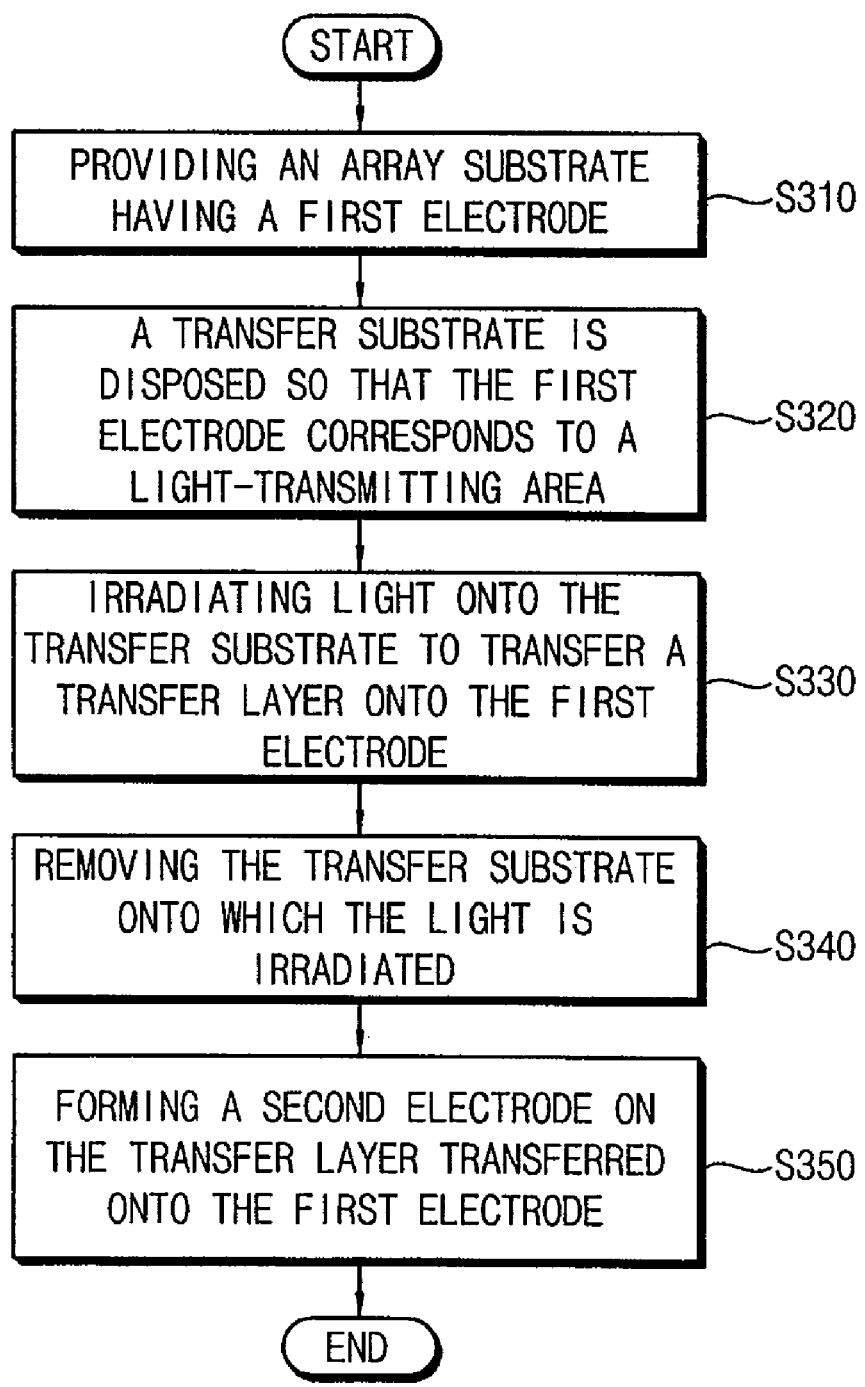

TRANSFER SUBSTRATE, METHOD OF MANUFACTURING THE SAME AND METHOD OF MANUFACTURING AN ORGANIC ELECTROLUMINESCENT ELEMENT

CROSS-REFERENCE TO RELATED APPLICATION

This application claims priority under 35 U.S.C. §119 to Korean Patent Application No. 2008-39785, filed on Apr. 29, 2008 in the Korean Intellectual Property Office (KIPO), the contents of which are herein incorporated by reference in their entirety.

BACKGROUND OF THE INVENTION

1. Field of the Invention

The present invention relates to a transfer substrate, a method of manufacturing the same and a method of manufacturing an organic electroluminescent element. More particularly, the present invention relates to a transfer substrate used in forming a pattern of a flat panel display device, a method of manufacturing the same and a method of manufacturing an organic electroluminescent element.

2. Description of the Related Art

Generally, in the manufacture of a large area high resolution organic electroluminescent element panel, the development of a technique for rapidly and accurately patterning an organic emission layer is considered important.

A method of patterning an organic emission layer on an array substrate includes a method using a shadow mask. However, the method using a shadow mask is not satisfactory for patterning a large substrate. In addition, the method includes an ink-jet printing method and a laser-induced thermal imaging (hereinafter referred to as "LITI") method.

In the LITI method, a transfer substrate is used to transfer the organic emission layer onto an array substrate. The transfer substrate includes a base layer including glass or resin, a light-to-heat conversion (LTHC) layer that converts laser light into thermal energy and an organic material transfer layer formed on the light-to-heat conversion layer.

The laser light may be provided in the form of a spot laser beam that illuminates a spot having a circular shape. A spot laser that produces the spot laser beam is accurately aligned to a target area of the array substrate, and the organic emission layer is transferred onto the target area of the array substrate. Thus, it is important that the array substrate and an irradiation point of the laser light are accurately aligned. However, when the spot laser is moved over a large array substrate to scan the transfer substrate, processing time and alignment error increase and the operating area required of the equipment for irradiating the laser light also increases.

SUMMARY OF THE INVENTION

The present invention provides a transfer substrate that is easily aligned and rapidly scanned during the manufacturing of a large flat panel display device.

The present invention also provides a method of manufacturing the above-mentioned transfer substrate.

The present invention also provides a method of manufacturing an organic electroluminescent element using the above-mentioned transfer substrate.

According to one aspect of the present invention, a transfer substrate includes a base layer, a light-reflecting layer pattern, a light-to-heat conversion layer and a transfer layer.

The light-reflecting layer pattern is disposed on a first face of the base layer. The light-reflecting layer pattern has a light-reflecting layer defining a plurality of light-transmitting areas. The light-to-heat conversion layer is disposed on the first face of the base layer corresponding to the light-transmitting areas. The transfer layer is formed on the light-to-heat conversion layer.

Openings may be formed through the light-transmitting areas in the light reflecting layer pattern. The light-to-heat conversion layer may be disposed in the openings. The light-to-heat conversion layer may extend to the light-reflecting area, and may be formed on the light-reflecting layer pattern. The transfer substrate may further include a planarization layer. The planarization layer may be formed on the light-reflecting layer pattern and the light-to-heat conversion layer. The transfer layer may be formed on the planarization layer.

Alternatively, the planarization layer may fill the openings formed through the light-reflecting layer pattern and may be formed on the light-reflecting layer pattern. The light-to-heat conversion layer may be formed on the planarization layer.

The light-reflecting layer pattern may include a plurality of optical interference layers and each of the optical interference layers may include a first thin film and a second thin film. The first thin film faces the first face of the base layer and has a first optical refractive index. The second thin film is disposed on the first thin film and has a second optical refractive index less than the first optical refractive index.

According to another aspect of the present invention, a transfer substrate includes a base layer, a light-to-heat conversion layer, a transfer layer and a light-reflecting layer pattern.

The light-to-heat conversion layer is disposed on a first face of the base layer. The transfer layer is formed on the light-to-heat conversion layer. The light-reflecting layer pattern is disposed on a second face opposite to the first face of the base layer. The light-reflecting layer pattern has a light-reflecting layer defining a plurality of light-transmitting areas.

The light-to-heat conversion layer may have a shape corresponding to the light-transmitting areas. Alternatively, the light-to-heat conversion layer may be disposed corresponding to all of the light-transmitting areas and the light-reflecting area.

The light-reflecting layer pattern may include a plurality of optical interference layers. Each of the optical interference layers includes a first thin film facing the second face of the base layer and having a first optical refractive index, and a second thin film disposed on the first thin film and having a second optical refractive index less than the first optical refractive index. Openings may be formed through the optical interference layers corresponding to the light-transmitting areas.

According to still another aspect of the present invention, there is provided a method of manufacturing a transfer substrate. A light-reflecting layer pattern having a light-reflecting area defining a plurality of light-transmitting areas is formed on a first face of a base layer. A light-to-heat conversion layer is formed on the first face of the base layer corresponding to the light-transmitting areas. A transfer layer is formed on the light-to-heat conversion layer.

In order to form the light-reflecting layer pattern, a light-reflecting layer may be formed on the first face of the base layer. Openings may be through the light-reflecting layer corresponding to the light-transmitting areas.

In order to form the light-reflecting layer pattern, a first thin film facing the first face of the base layer and having a first optical refractive index may be formed, and a second thin film having a second optical refractive index less than the first optical refractive index on the first thin film may be formed.

The light-to-heat conversion layer may be formed by forming a light-to-heat conversion material in the openings. Before the transfer layer is formed, a planarization layer may be further formed on the light-to-heat conversion layer.

Alternatively, before the light-to-heat conversion layer is formed, the planarization layer may be formed to fill the openings formed through the light-reflecting layer pattern and to be disposed on the light-reflecting layer pattern. The light-to-heat conversion layer may be formed on the planarization layer.

According to still another aspect of the present invention, there is provided a method of manufacturing a transfer substrate. A light-to-heat conversion layer is formed on a first face of a base layer. A transfer layer is formed on the light-to-heat conversion layer. A light-reflecting layer pattern having a plurality of light-transmitting areas and a light-reflecting area defining the light-transmitting areas on a second face opposite to the first face of the base layer is formed.

The light-to-heat conversion layer may be removed at the light-reflecting area, so that the light-to-heat conversion layer has a pattern that corresponds to the light-transmitting areas.

In order to form the light-reflecting layer pattern, a first thin film facing the second face of the base layer and having a first optical refractive index may be formed. A second thin film having a second optical refractive index less than the first optical refractive index on the first thin film may be formed. An opening through the first thin film and the second thin film may be formed corresponding to the light-transmitting area.

According to still another aspect of the present invention, there is provided a method of manufacturing organic electroluminescent element. An array substrate in which a plurality of first electrodes is exposed is provided.

A transfer substrate including a light-reflecting layer pattern having a light-reflecting area defining a plurality of light-transmitting areas, a light-to-heat conversion layer disposed at the light-transmitting areas, and a transfer layer formed on the light-to-heat conversion layer on the array substrate, so that the light-transmitting areas correspond to the first electrodes.

Light is irradiated onto the transfer substrate through the light-transmitting areas to transfer a portion of the transfer layer onto the first electrodes.

The transfer substrate onto which the light is irradiated is removed from the array substrate. A second electrode is formed on the transfer layer transferred onto the first electrodes.

The transfer layer may be transferred onto the first electrodes by using a line laser beam extending in a first direction to scan the light-reflecting layer pattern in a second direction different from the first direction. A plurality of transfer substrates respectively may include the transfer layer having different colors from each other, and each transfer layer of the transfer substrates may be independently transferred onto an associated array of the first electrodes.

An additional transfer substrate may be disposed corresponding to a different array area of the array substrate. An irradiation apparatus providing the irradiating line laser beam may be moved over to the additional transfer substrate, so as not to deviate from the array substrate. The line laser beam irradiates the additional transfer substrate to transfer the transfer layer onto the first electrodes.

According to the above described transfer substrate, alignment and laser scan of equipments may be simplified to reduce processing time and a large flat panel display device having an organic electroluminescent element may be efficiently manufactured.

BRIEF DESCRIPTION OF THE DRAWINGS

The above and other features and advantages of the present invention will become more apparent in view of the following detailed description of exemplary embodiments thereof taken with reference to the accompanying drawings, wherein:

FIG. 5 is a flow chart illustrating a method of manufacturing an organic electroluminescent element by using the transfer substrate illustrated in FIGS. 1 and 2;

DETAILED DESCRIPTION OF THE INVENTION

Figure 1:
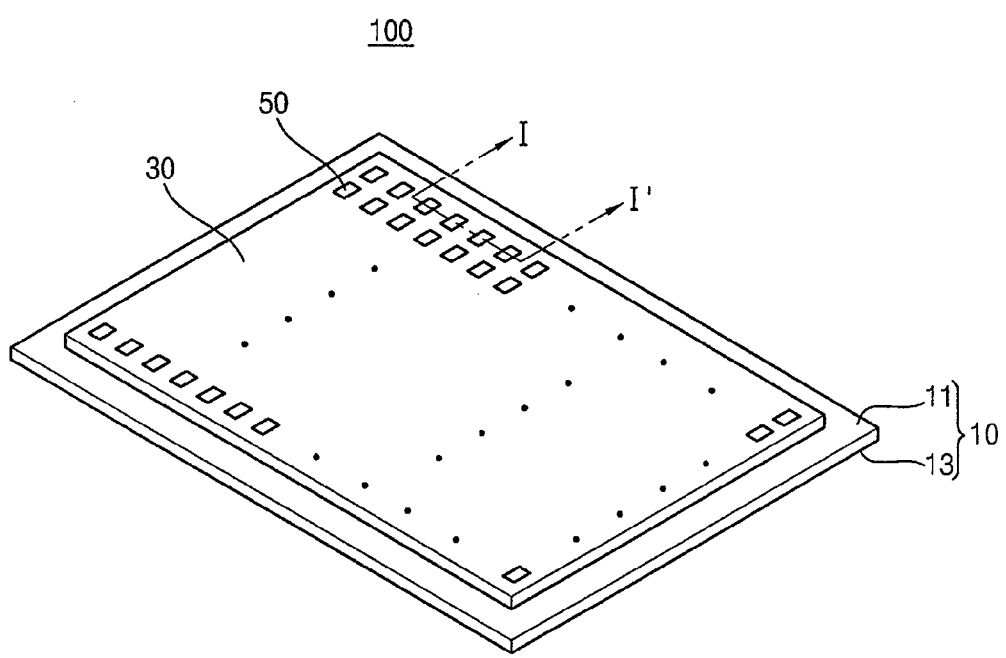
FIG. 1 is a perspective view illustrating a transfer substrate according to a first embodiment of the present invention.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention is explained in detail with reference to the accompanying drawings.

First Embodiment

Figure 2:
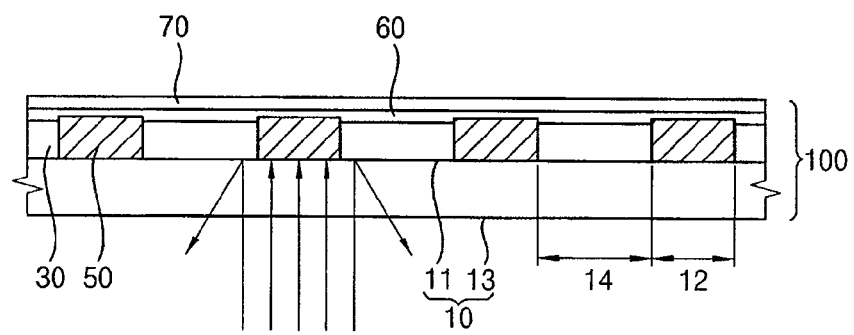
FIG. 2 is a cross-sectional view taken along a line I-I' in FIG. 1.

FIG. 1 is a perspective view illustrating a transfer substrate according to a first embodiment of the present invention. FIG. 2 is a cross-sectional view taken along a line I-I' in FIG. 1.

A transfer substrate may be used in a laser-induced thermal imaging (LITI) method in which a predetermined pattern is transferred onto a target substrate. The transfer substrate may alternatively be called a donor substrate.

Referring to FIGS. 1 and 2, the transfer substrate 100 includes a base layer 10, a light-reflecting layer pattern 30, a light-to-heat conversion layer 50 and a transfer layer 70.

The base layer 10 includes a first face 11 and a second face 13 opposite to the first face 11. Light is incident onto the second face 13 of the base layer 10. The base layer 10 may include a glass substrate or a resin film. The thickness of the base layer 10 may between tens of micrometers and hundreds of micrometers.

Exemplary resins of the base layer 10 include polyethylene terephthalate, polyester, polyacryl, polyepoxy, polyethylene, and polystyrene. In an exemplary embodiment, base layer 10 may include a polyethylene terephthalate film. The base layer 10 may have high optical transmissivity, and sufficient mechanical and chemical stability.

The light-reflecting layer pattern 30 is disposed on the first face 11 of the base layer 10. Light-transmitting areas 12 are arranged in a substantially rectangular matrix array and a light-reflecting area 14 enclosing the light-transmitting areas 12 may be defined on the first face 11 of the base layer 10. Each light-transmitting area 12 corresponds to a transfer area of a target onto which the transfer layer 70 is transferred from the transfer substrate 100. The light-reflecting area 14 corresponds to a non-transfer area.

The light-reflecting layer pattern 30 is disposed in the light-reflecting area 14, and may have a thickness between tens of micrometers and hundreds of micrometers. Openings may be formed as the light-transmitting areas 12 of the light-reflecting layer pattern 30.

The light-reflecting layer pattern 30 may include a layer of metal having high reflectivity, such as copper and aluminum. Thus, the light that is incident onto the second face 13 of the base layer 10 includes light that is incident onto the light-transmitting area 12 and passes through the light-transmitting area 12, and light that is incident onto the light-reflecting area 14 and is reflected from the light-reflecting layer pattern 30.

The light-to-heat conversion layer 50 is disposed on the first face 11 of the base layer 10. In the present exemplary embodiment, the light-to-heat conversion layer 50 is disposed in the openings formed through the light-reflecting layer pattern 30, and completely fills the openings in the light-reflecting layer pattern 30. Thus, the light-to-heat conversion layer 50, as illustrated in FIG. 1, forms a light-to-heat conversion layer pattern corresponding to the openings. Thus, the light-to-heat conversion layer 50 may be formed to have a thickness substantially similar to that of the light-reflecting layer pattern 30.

The light-to-heat conversion layer 50 absorbs light such as infrared light, visible light, ultraviolet light, that is incident onto the second face 13 of the base layer 10 and partially converts the absorbed light into heat in areas of the light-to-heat conversion layer 50 corresponding to the light-transmitting areas 12. Thus, the light-to-heat conversion layer 50 may have a high optical density, and may include a light-absorbing material.

The light-to-heat conversion layer 50 may include a non-organic layer. Thus, materials for forming the light-to-heat conversion layer 50 may include, for example, aluminum oxide, aluminum sulfide, or chromium silicide, as the light-absorbing material.

Alternatively, the light-to-heat conversion layer 50 may include an organic polymer layer. The materials for forming light-to-heat conversion layer 50 may include for example, carbon black, graphite, or infrared dye.

The transfer layer 70 is disposed on the light-to-heat conversion layer 50. The transfer layer 70, as illustrated in FIG. 2, is formed in the light-transmitting area 12 and the light-reflecting area 14. In other words, the transfer layer 70 is formed on the light-to-heat conversion layer 50 and the light-reflecting layer pattern 30. Alternatively, the transfer layer 70 may be patterned so that it remains only in areas corresponding to the light-transmitting areas 12.

The term "transfer layer" as used herein encompasses any layer that is a transferable layer that can be used for laser induced thermal imaging. The transfer layer 70 may include a single layer or multiple layers including at least one layer selected from the group consisting of an organic emission layer, an organic hole injection layer, an organic hole transport layer, an organic hole blocking layer, an organic electron transport layer and an organic electron injection layer. The organic layers may include a low molecular weight material or a high molecular weight material.

The transfer substrate 100 may include a planarization layer 60 interposed between the transfer layer 70 and the light-to-heat conversion layer 50 and between the transfer layer 70 and the light-reflecting layer pattern 30. The planarization layer 60 provides a planar surface and may also prevent materials in the light-to-heat conversion layer 50 from diffusing to the transfer layer 70.

In the above-described transfer substrate 100, light incident onto the light-to-heat conversion layer 50 causes the corresponding portion in the transfer layer to be transferred to a target substrate. Light that is incident elsewhere on the transfer substrate 100 does not cause any transfer of the transfer layer. Thus, whereas it was formerly necessary to accurately align a spot beam laser on each of the transfer areas one by one to effect the transfer of the transfer layer to a target substrate, with the present invention the desired portions of the transfer layer may be transferred by scanning a line beam laser across the entire second face 13 of the transfer substrate 100.

Figure 3:
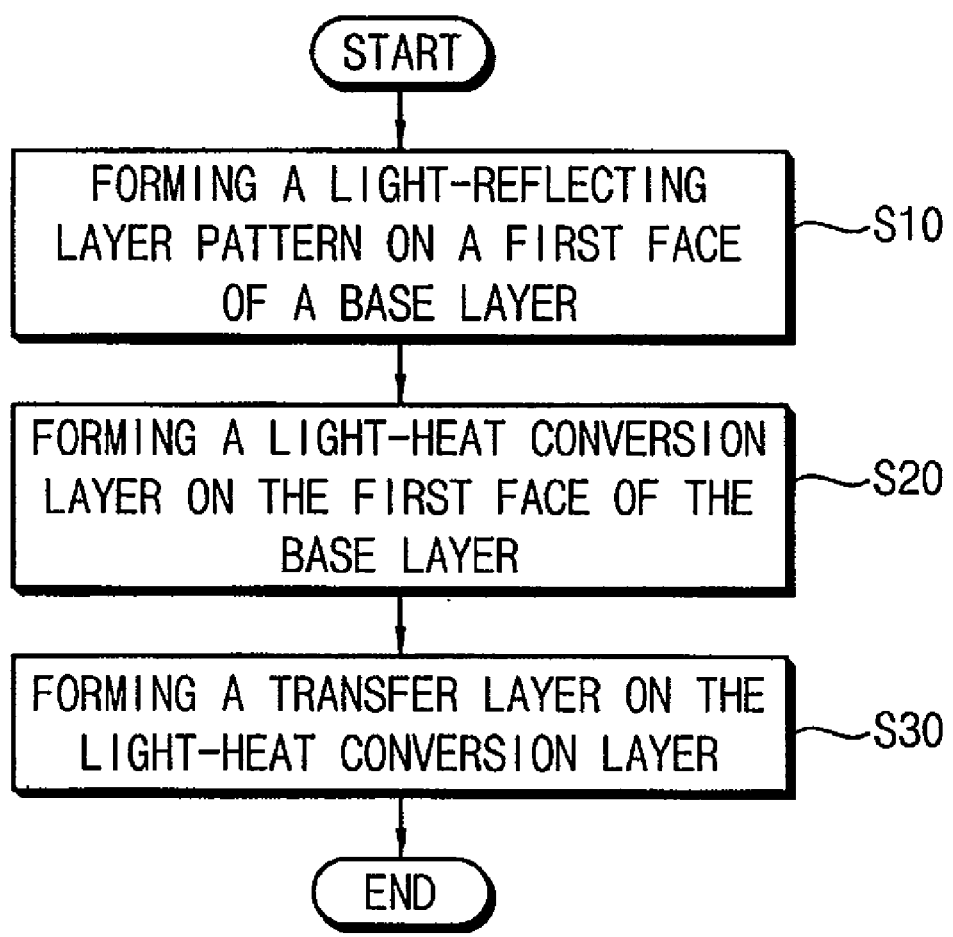
FIG. 3 is a flow chart illustrating a method of manufacturing the transfer substrate illustrated in FIGS. 1 and 2.
Figure 4A:
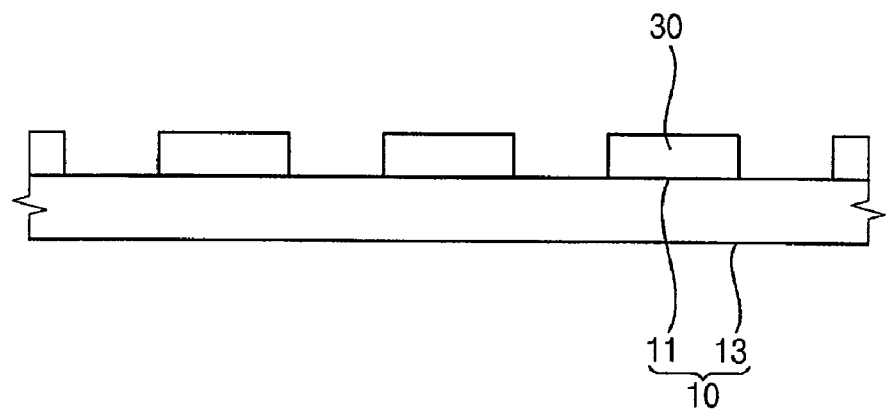
FIGS. 4A to 4C are cross-sectional views illustrating the method of manufacturing the transfer substrate according to the flow chart in FIG. 3.
Figure 4B:
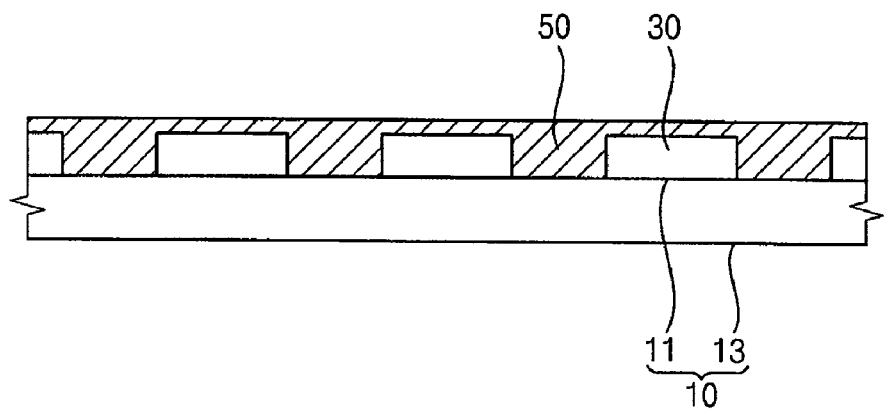
Figure 4C:
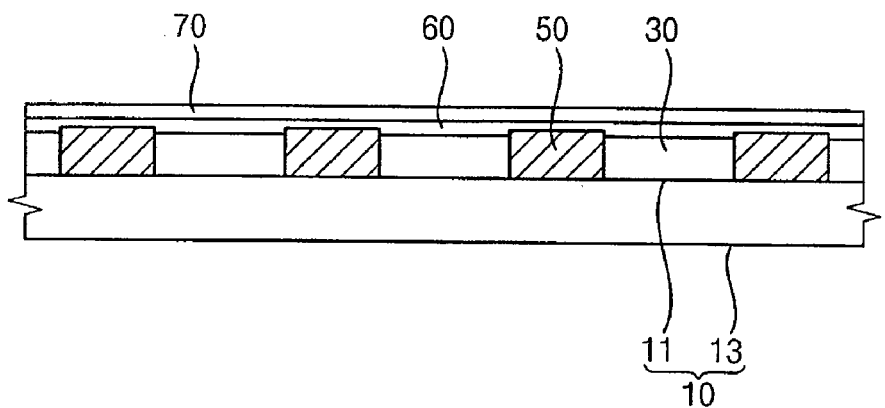

FIG. 3 is a flow chart illustrating a method of manufacturing the transfer substrate of FIG. 2. FIGS. 4A to 4C are cross-sectional views illustrating the method of manufacturing the transfer substrate according to the flow chart in FIG. 3.

Referring to FIGS. 3 to 4C, in order to manufacture the transfer substrate 100, first, a light-reflecting layer is formed on the first face 11 of the base layer 10, the base layer 10 may include glass or resin, and the light-reflecting layer is patterned to form a light-reflecting layer pattern 30 (step S10).

Thus, a metal layer such as an aluminum layer or a copper layer may be formed on the first face 11 of the base layer 10 to a thickness of tens to hundreds of micrometers to provide the light-reflecting layer by using, for example, a vapor deposition method, an electron beam deposition method, a sputtering method, or another suitable method.

Then, the light-reflecting layer is etched by using a photolithographic method to form, as illustrated in FIG. 4A, the light-reflecting layer pattern 30 in which openings corresponding to the light-transmitting areas 12 are formed.

Thereafter, the light-to-heat conversion layer 50 is formed on the first face 11 of the base layer 10 on which the light-reflecting layer pattern 30 is formed (step S20).

The light-to-heat conversion layer 50 which may include a non-organic layer including a light-absorbing material such as aluminum oxide, aluminum sulfide, or chromium silicide or alternatively, may include an organic layer including a light-absorbing material such as carbon black, graphite, or infrared dye, is deposited to cover the openings and the light-reflecting layer pattern 30, as illustrated in FIG. 4B.

Then, the light-to-heat conversion layer is patterned by using a photolithographic method, to form the patterned light-to-heat conversion layer 50, as illustrated in FIG. 4C. The upper portion of the light-to heat conversion layer 50 is removed to expose the top surface of the light-reflecting layer patter 30. Alternatively, the upper portion of the light-to-heat conversion layer may be removed by etching without a mask.

An upper portion of the light-to-heat conversion layer 50 may protrude above the top the light-reflecting layer pattern 30. In order to provide a planarized surface, the planarization layer 60 may be formed to cover the light-to-heat conversion layer 50 and the light-reflecting layer pattern 30.

Finally, as illustrated in FIG. 4C, the transfer layer 70 is formed on the planarization layer 60 to complete the manufacture of the transfer substrate 100 (step S30).

The transfer layer 70 may include a single layer or multiple layers that are transferable by laser-induced thermal imaging, including at least one selected from the group consisting of an organic emission layer, an organic hole injection layer, an organic hole transport layer, an organic hole blocking layer, an organic electron transport layer and an organic electron injection layer.

FIG. 5 is a flow chart illustrating a method of manufacturing an organic electroluminescent element by using the transfer substrate illustrated in FIGS. 1 and 2. FIGS. 6A to 6D are cross-sectional views illustrating the method of manufacturing the organic electroluminescent element according to the flow chart in FIG. 5.

Figure 6A:
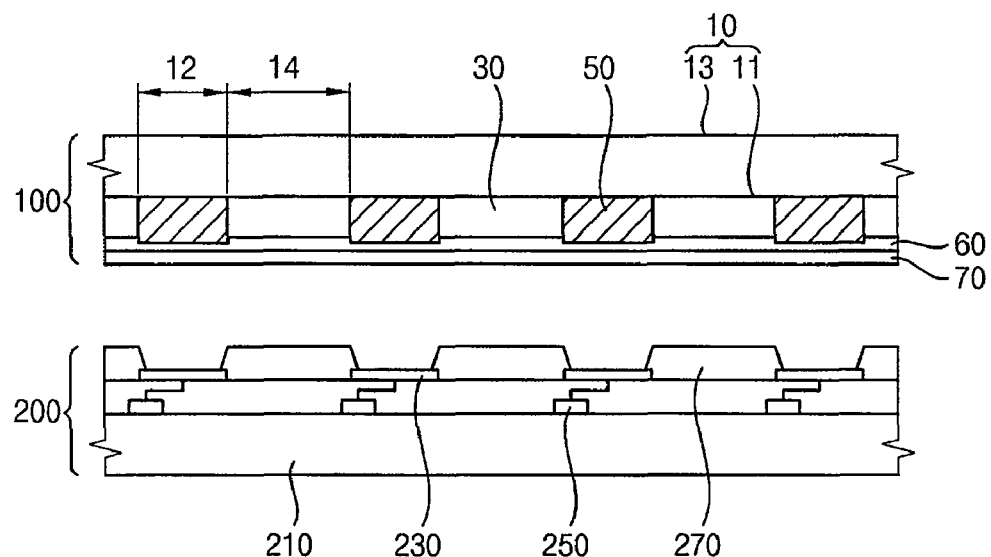
FIGS. 6A to 6D are cross-sectional views illustrating the method of manufacturing the organic electroluminescent element according to the flow chart in FIG. 5.
Figure 6B:
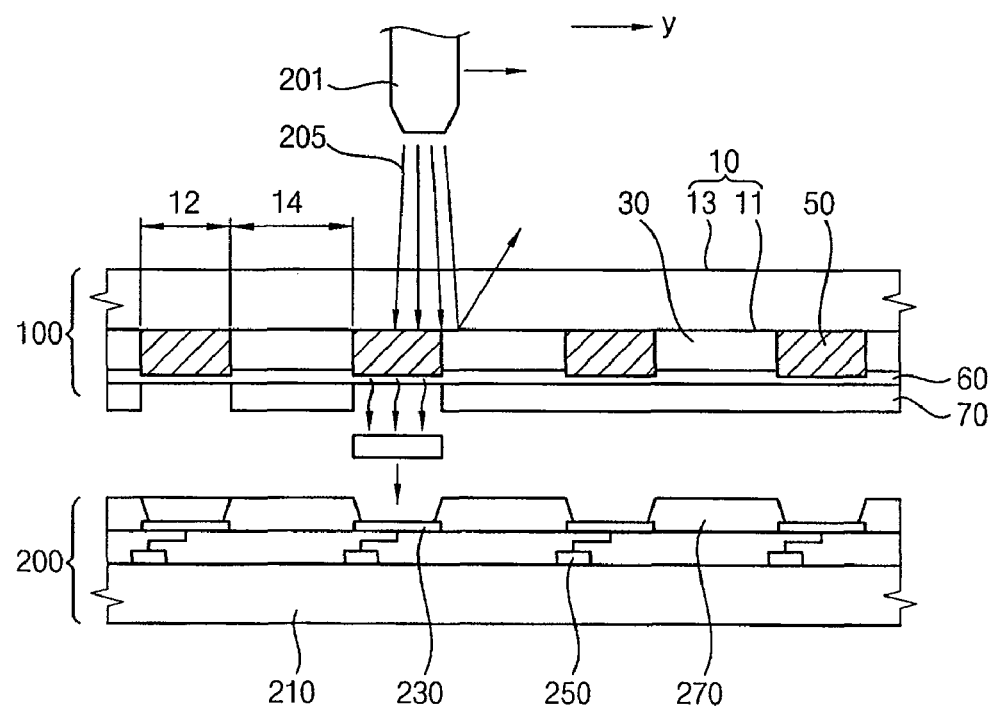
Figure 6C:
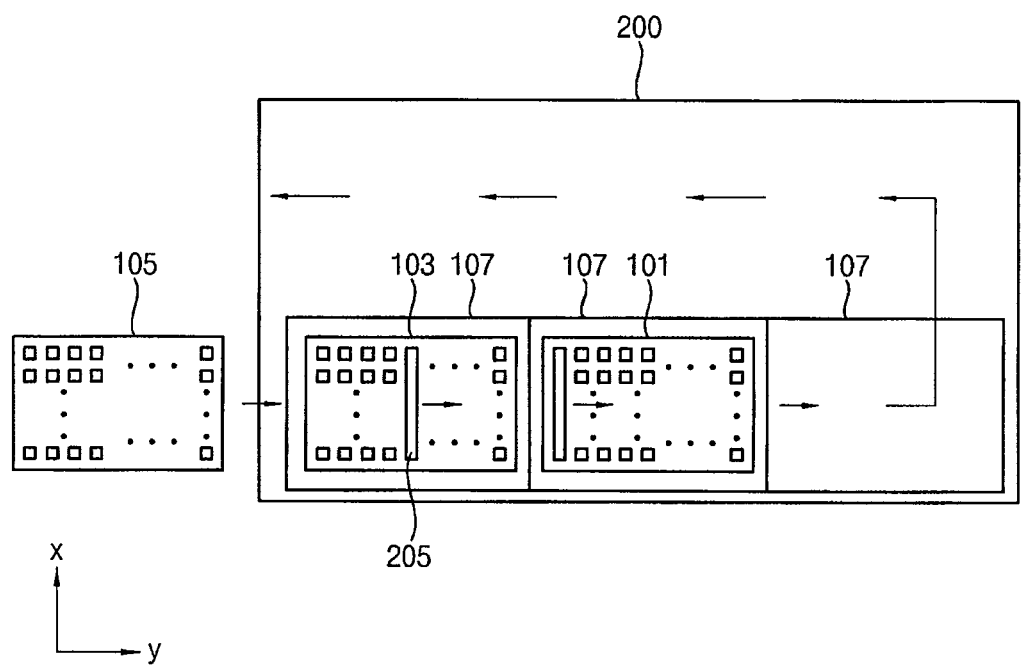
Figure 6D:
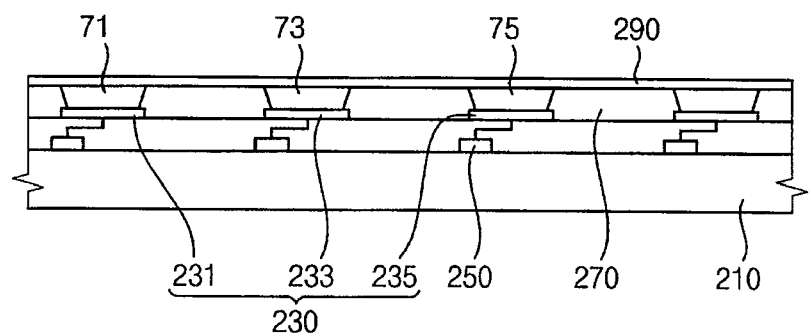

Referring to FIGS. 5 to 6D, in order to manufacture an organic electroluminescent element, an array substrate 200 is firstly provided as illustrated in FIG. 6A (step S310).

The array substrate 200 includes a substrate 210 and first electrodes 230 formed in an array on the substrate 210. The array substrate 200 may further include switching elements 250 and a light blocking partition pattern 270. Switching elements 250 are each disposed between each first electrode 230 and the substrate 210, and each is electrically connected to the first electrode 230. The light blocking partition pattern 270 covers an edge portion of each first electrode 230, so that all but the edge portion of each first electrode 230 is exposed.

Then, as illustrated in FIG. 6A, the transfer substrate 100 is disposed on the array substrate 200 (step S320).

The transfer layer 70 faces the array substrate 200, and the transfer substrate 100 is aligned relative to the array substrate 200 so that the light-to-heat conversion layer 50 corresponding to the light-transmitting areas 12 of the transfer substrate 100 is aligned relative to the array of the first electrodes 230.

Thereafter, light is irradiated onto the second face 13 of the base layer 10 of the transfer substrate 100 to transfer portions of the transfer layer 70 onto the first electrodes 230, as illustrated in FIGS. 6B and 6C (step S330).

Laser light (e.g., line laser beam 205) may be used to irradiate the second surface 13. The laser light may have a wavelength of about 800 nanometers. The line laser beam 205 may illuminate an area having a band shape extending in a first direction x, as illustrated in FIG. 6C. The first direction x may be substantially perpendicular to a second direction y corresponding to a scan direction of the line laser beam 205. Alternatively, in accordance with the present invention, the second surface 13 of the base layer 10 may be scanned with a spot laser, or with a laser having any suitable beam shape.

The line laser beam 205 is incident onto the second face 13 of the base layer 10 and passes through the base layer 10. After passing through the base layer 10, the portion of the line laser beam 205 that is incident onto the light-reflecting layer pattern 30 is reflected. The light-to-heat conversion layer 50 absorbs the light of the line laser beam 205 that is incident onto the light-transmitting areas 12, and partially converts the absorbed line laser beam 205 into thermal energy. An adhesive force between the transfer layer 70 and the light-to-heat conversion layer 50 is weakened due to the thermal energy, so that heated portions of the transfer layer 70 separate from the light-to-heat conversion layer 50 and are transferred onto the first electrodes 230.

According to the above, since the array substrate 200 and the transfer substrate 100 are aligned with respect to each other, it is not necessary to align the laser irradiation apparatus 201 that generates the line laser beam 205, relative to the array substrate 200. Thus, the process of manufacturing an organic electroluminescent element is simplified, resulting in a shorter processing time.

In addition, the transfer layer 70 is transferred onto the first electrodes 230 of the array substrate 200 by scanning the line laser beam 205 across the second face 13 of the base layer 10 without designating a predetermined area at which light must be accurately directed. Thus, instead of a spot laser beam having a circular or elliptic cross-section, the above-described line laser beam 205 may be used. When the line laser beam 205 is used, portions of the transfer layer 70 may be transferred onto a predetermined array of the first electrodes 230 by scanning the laser irradiation apparatus 201 once in the second direction y other than the first direction x.

FIG. 6C is a plan view illustrating a scanning operation of the laser irradiation apparatus 201 of FIG. 6B. The array substrate 200 in FIG. 6C, includes a number of array areas 107. FIG. 6D is a cross-sectional view illustrating a portion of an array area 107 of the array substrate 200 onto which three transfer layers 70 are transferred.

Referring to FIGS. 6C and 6D, the transfer layers 70 are transferred onto first electrodes 230 in array areas 107 of the large array substrate 200 by using a plurality of transfer substrates 100 (e.g., a first transfer substrate 101, a second transfer substrate 103 and a third transfer substrate 105). In FIG. 6C, a second transfer substrate 103 is shown in the array area 107 in which a first transfer substrate 101 (not shown) has previously been applied and in which a third transfer substrate 105 (not shown) is to be applied. There is also shown in FIG. 5 the array area 107 in which a first transfer substrate 101 is present. The transfer substrates 101, 103, and 105 have different patterns of light-to-heat conversion areas, though to simplify the illustration these differences are not shown.

FIG. 6D shows a portion of the array area 107 after the first, second and third transfer masks have been applied in sequence to transfer the first, second and third organic emission layers onto first, second and third arrays, respectively, of first electrodes on the array area. The first transfer substrate 101 may include a transfer layer 70 having a red organic emission layer 71, and the first transfer substrate 101 may be disposed on an array area 107 to transfer the red organic emission layer 71 onto a first array 231 of the first electrodes 230 by one scan of the line laser beam 205.

Then, the second transfer substrate 103 having a green organic emission layer 73 may be disposed on the array area 107 to transfer the green organic emission layer 73 onto a second array 233 of the first electrodes 230 by one scan of the line laser beam 205.

Thereafter, the third transfer substrate 105 having a blue organic emission layer 75 may be disposed on the array area 107 to transfer the blue organic emission layer 75 onto a third array 235 of the first electrodes 230 by one scan of the line laser beam 205.

After the process of transferring three organic emission layers of three colors to a first array area 107 is completed, the process may be repeated on a second array area 107 adjacent to the first array area.

Alternatively, a plurality of first transfer substrates 101 may be disposed, one on each of the array areas 107, on the array substrate 200 and the red organic emission layer 71 may be transferred by application of laser light to all the array areas 107. Then, a plurality of second transfer substrates 103 may be disposed on the array areas 107 on the array substrate 200 and the green organic emission layer 73 may be transferred. Then, a plurality of third substrates 105 may be disposed on the array areas on the array substrate 200 and the blue organic emission layer 75 may be transferred.

A plurality of laser irradiation apparatuses 201 or one laser irradiation apparatus 201 may be provided for scanning the array substrate 200. When only one laser irradiation apparatus 201 is provided for the entire array substrate 200, the array areas 107 may be scanned sequentially. When a plurality of laser irradiation apparatuses 201 is provided, some or all of the array areas 107 may be scanned simultaneously. According to the above, when the transfer substrate 100 is completely scanned by using the line laser beam 205, a transfer layer such as a desired organic emission layer may be transferred. Thus, the laser irradiation apparatus 201 may be randomly moved within the array substrate 200 while the line laser beam 205 irradiates the array areas 107.

In FIG. 6D a portion of an array area 107 is shown, at a point after the third transfer substrate 105 (onto which the line laser beam 205 has been scanned), is removed from the array substrate 200 (step S340).

For example, the red organic emission layer 71 is transferred onto the first array 231 of the first electrodes 230, the green organic emission layer 73 is transferred onto the second array 233 of the first electrodes 230, and the blue organic emission layer 75 is transferred onto the third array 235 of the first electrodes 230. Thereafter, the third transfer substrate 105 disposed on the array substrate 200 is removed.

A set of transfer substrates may be used to transfer a sequence of transfer layers onto the first electrodes. The steps, listed in the flow chart of FIG. 5, for disposing a transfer substrate on the array substrate S320, irradiating the transfer substrate to transfer a transfer layer S330, and removing the transfer substrate S340 are repeated for each of the transfer substrates sequentially.

Finally, a second electrode 290 is formed on the transferred red, green and blue organic emission layers 71, 73 and 75 to form the organic electroluminescent element (step S350).

According to the method of manufacturing the organic electroluminescent element, each of the transfer layers such as an organic emission layer may be transferred onto the first electrodes 230 by simply laser scanning each of a set of transfer substrates 100 without aligning the line laser beam 205 to particular features on the transfer substrates 100. Thus, processing time may be reduced.

In addition, alignment error between the array substrate 200 and the transfer substrate 100 may be more easily maintained within a predetermined limit than alignment error between the first electrode 230 and a laser irradiation spot, which is generated when a laser irradiation apparatus of a spot type is moved between the first electrodes 230.

Therefore, according to the method of manufacturing the organic electroluminescent element of the present invention, the transfer layers such as organic emission layers may be rapidly and accurately transferred onto the large-size array substrate 200.

Second Embodiment

Figure 7:
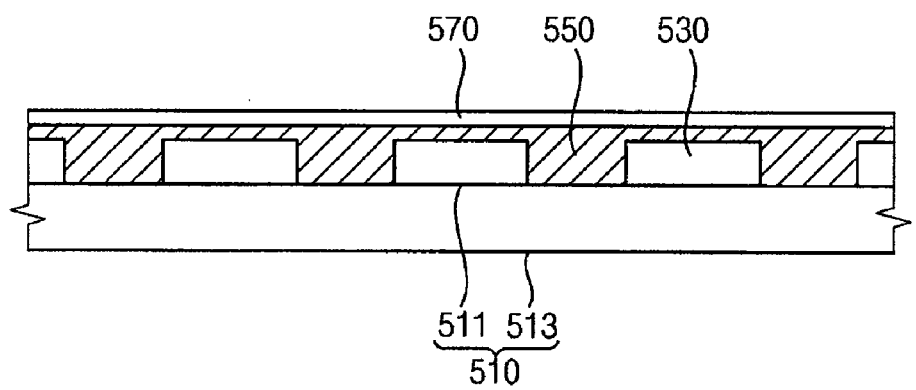
FIG. 7 is a cross-sectional view illustrating a transfer substrate according to a second embodiment of the present invention.

FIG. 7 is a cross-sectional view illustrating a transfer substrate according to a second embodiment of the present invention.

Referring to FIG. 7, a transfer substrate 500 according to a second embodiment of the present invention may be provided substantially the same as the transfer substrate 100 of FIGS. 1 and 2, except that a light-to-heat conversion layer 550 is formed on and remains on both the light-transmitting area and the light-reflecting area instead of remaining only on the light transmitting area as in the light-to-heat conversion layer 50 of the first Embodiment, and that a planarization layer is not required. Thus, corresponding reference numerals are used to refer to corresponding elements, and any further description is therefore omitted.

In the second exemplary embodiment, the light-to-heat conversion layer 550 covers openings formed through a light-reflecting layer pattern 530 and covers the light-reflecting layer pattern 530. An upper face of the light-to-heat conversion layer 550, as formed, may be formed planarized. Thus, a planarization layer is omitted. A transfer layer 570 is formed on the upper face of the light-to-heat conversion layer 550.

In a method of manufacturing the transfer substrate 500 according to the present embodiment, the step of forming a light-reflecting layer pattern 530 on a first face 511 of a base layer 510 may be provided substantially the same as the step of forming the light-reflecting layer pattern 30 shown in FIG. 4A.

Then, the light-to-heat conversion layer 550 is formed on the light-reflecting layer pattern 530 and on the first face 511 of the base layer 510. The light-to-heat conversion layer 550 may be a non-organic layer including a light-absorbing material such as aluminum oxide, aluminum sulfide, or chromium silicide, or, alternatively, may be an organic layer including a light-absorbing material such as carbon black, graphite, or infrared dye. The light-to-heat conversion layer is deposited to cover the base layer 510 on which the light-reflecting layer pattern 530 is formed as illustrated in FIG. 7.

In the present embodiment, in the step of forming the light-to-heat conversion layer 550, the non-organic layer or the organic layer is not patterned by using a separate photolithographic step. Thus, the step of forming the light-to-heat conversion layer 550 is different from the step of forming the light-to-heat conversion layer 50 shown in FIG. 4C. Thus, the upper face of the light-to-heat conversion layer 550 may be planar as illustrated in FIG. 7. Accordingly, a process of forming a planarization layer is omitted in the second embodiment, which is different in this respect from the first embodiment.

Thereafter, the transfer layer 570 is formed on the upper face of the light-to-heat conversion layer 550. A method of forming the transfer layer 570 may be substantially the same as the method of forming the transfer layer 70 shown in FIG. 4C, except that the transfer layer 570 is disposed directly on the light-to-heat conversion layer 550 rather than on the planarization layer 60. Thus, any further description is omitted.

A method of manufacturing an organic electroluminescent element according to the present embodiment may be provided substantially the same as the method of manufacturing the organic electroluminescent element illustrated in FIGS. 5 to 6D, except that the transfer substrate 500 illustrated in FIG. 7 is used instead of the transfer substrate 100. Thus, any further description is omitted.

Third Embodiment

Figure 8:
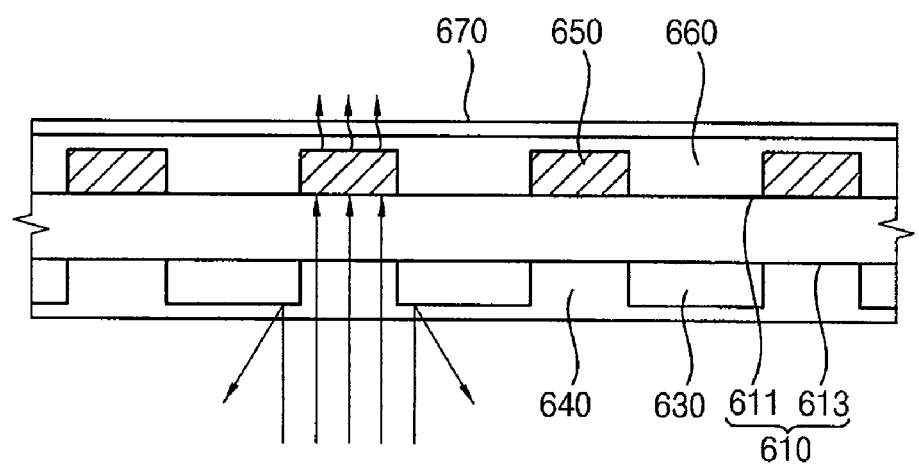
FIG. 8 is a cross-sectional view illustrating a transfer substrate according to a third embodiment of the present invention.

FIG. 8 is a cross-sectional view illustrating a transfer substrate according to a third embodiment of the present invention.

Referring to FIG. 8, a transfer substrate 600 according to a third embodiment of the present invention may be provided substantially the same as the transfer substrate 100 illustrated in FIGS. 1 and 2, except that a light-reflecting layer pattern 630 is formed on a second face 613 of a base layer 610, and the transfer substrate 600 further includes a protective layer 640 covering the light-reflecting layer pattern 630. Thus, corresponding reference numerals are used to refer to substantially the same elements, and any further description is omitted.

In the present embodiment, the light-reflecting layer pattern 630 is disposed on the second face 613 of the base layer 610. Openings are formed through the light-reflecting layer pattern 630 corresponding to light-transmitting areas. Details such as material or function, of the light-reflecting layer pattern 630 are substantially the same as the corresponding details of the light-reflecting layer pattern 30 as described in conjunction with FIGS. 1 and 2. Thus, any further description is omitted.

The protective layer 640 covers and protects the light-reflecting layer pattern 630. The protective layer 640 may include transparent resin having a high optical transmissivity.

The light-to-heat conversion layer 650 is formed on a first face 611 of the base layer 610 and is patterned by a photolithographic method. A planarization layer 660 is applied to the light-to-heat conversion layer 650 to provide a planar surface. The planarization layer 660 fills the spaces in the patterned light-to-heat conversion layer 650. A transfer layer 670 is formed on the planarization layer 660.

In a method of manufacturing the transfer substrate 600 according to the present embodiment, a light-reflecting layer is formed on the second face 613 of the base layer 610, and then the light-reflecting layer is etched by a photolithographic method to form the light-reflecting layer pattern 630. The method of manufacturing the transfer substrate 600 is different from the method of manufacturing the transfer substrate 100, in that the light-reflecting layer pattern 50 is formed on the first surface 11 of the base layer 10. Details such as material or function of the light-reflecting layer pattern 630 are substantially the same as the corresponding material or function described in conjunction with FIGS. 4A to 4C. Thus, any further description is omitted.

Details such as a method of forming a light-to-heat conversion layer 650, a planarization layer 660 and a transfer layer 670 on the first face 611 of the base layer 610 are substantially the same as described in conjunction with FIGS. 4A to 4C. Thus, any further description is omitted.

The light-reflecting layer pattern 630 may be formed before the light-to-heat conversion layer 650 is formed or vice versa.

A method of manufacturing an organic electroluminescent element according to the present embodiment may be provided substantially the same as the method of manufacturing the organic electroluminescent element illustrated in FIGS. 5 to 6D, except that the transfer substrate 600 illustrated in FIG. 8 is used instead of the transfer substrate 100. Thus, any further description is omitted.

Fourth Embodiment

Figure 9:
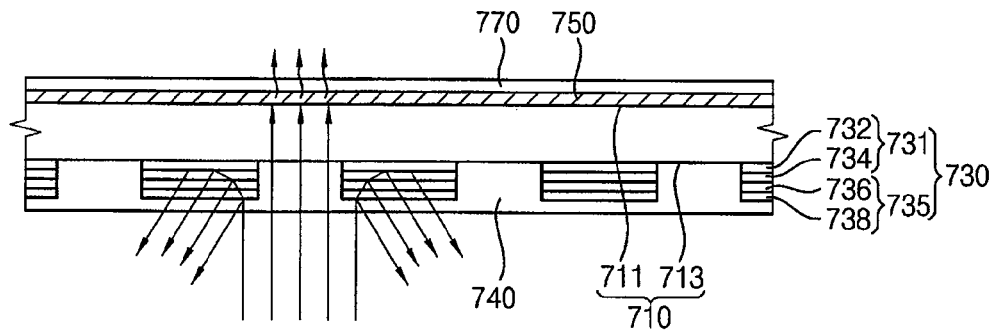
FIG. 9 is a cross-sectional view illustrating a transfer substrate according to a fourth embodiment of the present invention.

FIG. 9 is a cross-sectional view illustrating a transfer substrate according to a fourth embodiment of the present invention.

Referring to FIG. 9, a transfer substrate 700 according to a fourth embodiment of the present invention may be provided substantially the same as the transfer substrate 100 illustrated in FIGS. 1 and 2, except that a light-reflecting layer pattern 730 is formed on a second face 713 of a base layer 710, the transfer substrate 700 further includes a protective layer 740 covering the light-reflecting layer pattern 730, the light-reflecting layer pattern 730 includes first and second optical interference layers 731 and 735, and a light-to-heat conversion layer 750 having a planar surface is formed on a first face 711 of the base layer 710 thus permitting a planarization layer to be omitted. Thus, corresponding reference numerals are used to refer to substantially the same elements, and any further description is omitted.

In the present embodiment, the light-reflecting layer pattern 730 is disposed on the second face 713 of the base layer 710. The light-reflecting layer pattern 730 includes a plurality of optical interference layers, for example, first and second optical interference layers 731 and 735 successively formed on the second face 713 of the base layer 710. The first and second optical interference layers 731 and 735 may include a plurality of thin films having different optical refractive index from each other. In the present embodiment, each of the first and second optical interference layers 731 and 735 includes two thin films.

The first optical interference layer 731 includes a first thin film 732 disposed on the second face 713 of the base layer 710 and a second thin film 734 formed on the first thin film 732. The first thin film 732 has a first optical refractive index, and the second thin film 734 has a second optical refractive index less than the first optical refractive index. The difference between the first optical refractive index and the second optical refractive index may be greater than or equal to about 0.8 so as to obtain optical reflection generated by optical interference.

The second optical interference layer 735 includes a third thin film 736 disposed on the second thin film 734 and a fourth thin film 738 formed on the third thin film 736. The third thin film 736 has a third optical refractive index, and the fourth thin film 738 has a fourth optical refractive index less than the third optical refractive index. The difference between the third optical refractive index and the fourth optical refractive index may be greater than or equal to about 0.8 so as to obtain optical reflection generated by optical interference.

Each of the first, second, third and fourth thin films 732, 734, 736 and 738 may have a thickness of about 100 nanometers to about 170 nanometers.

According as the first, second, third and fourth thin films 732, 734, 736 and 738 are disposed as described above, the light-reflecting layer pattern 730 has an optical structure in which thin films of high optical refractive index alternate with thin films of low optical refractive index. Light repetitively reflects and refracts on interfaces of the first, second, third and fourth thin films 732, 734, 736 and 738, and incident light is partially transmitted through and partially reflected from the light-reflecting layer pattern 730.

The light-reflecting layer pattern 730 may selectively reflect light of a predetermined wavelength due to structural optical interference of the first, second, third and fourth thin films 732, 734, 736 and 738. In the case where laser light that is irradiated onto the transfer substrate 700 has a wavelength of about 800 nanometers, the amount of the laser light reflected may be greater than or equal to about 95% with respect to the total amount of the incident laser light when optical refractive indices of the first, second, third and fourth thin films 732, 734, 736 and 738 are properly selected and the number of optical interference layers is properly selected.

The materials used in the first and third thin films 732 and 736 have a relatively high optical refractive index and may include, for example, titanium dioxide ($TiO_2$) having an optical refractive index of about 2.4, zirconium dioxide ($ZrO_2$) having an optical refractive index of about 2.1, indium tin oxide (ITO) having an optical refractive index of about 2.1 or silicon nitride ($SiN_x$) having an optical refractive index of about 2.1.

The materials used in the second and fourth thin films 734 and 738 have a relatively low optical refractive index and may include, for example, lithium fluoride (LiF) having an optical refractive index of about 1.4 and silicon dioxide ($SiO_2$) having an optical refractive index of about 1.45.

Figure 10A:
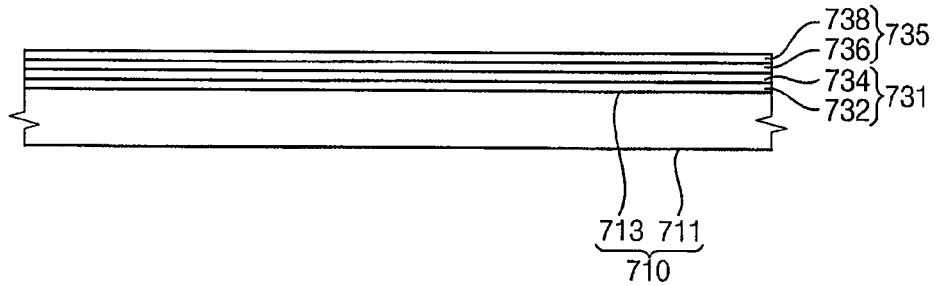
FIGS. 10A to 10C are cross-sectional views illustrating a method of manufacturing the transfer substrate illustrated in FIG. 9.
Figure 10B:
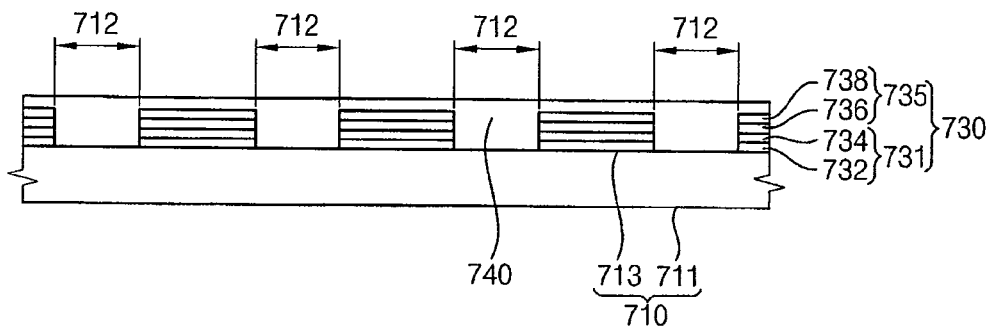
Figure 10C:
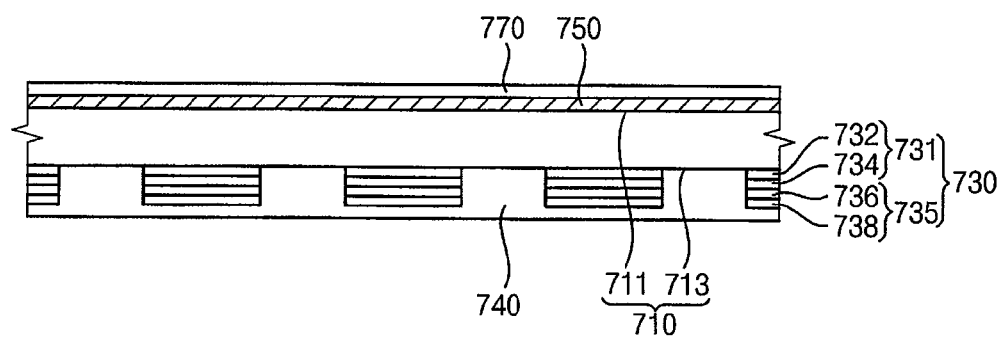

FIGS. 10A to 10C are cross-sectional views illustrating a method of manufacturing the transfer substrate illustrated in FIG. 9.

In order to manufacture the transfer substrate 700, the first and second optical interference layers 731 and 735 illustrated in FIG. 9 are formed on the second face 713 of the base layer 710, as shown in FIG. 10A. Then, as illustrated in FIG. 10B, openings are formed through the first and second optical interference layers 731 and 735 corresponding to the light-transmitting areas 712 to form the light-reflecting layer pattern 730. Thereafter, the protective layer 740 is formed to cover the light-reflecting layer pattern 730, as shown in FIG. 10B.

Then, as illustrated in FIG. 10C, the light-to-heat conversion layer 750 is formed on the first face 711 of the base layer 710, and a transfer layer 770 is formed on the light-to-heat conversion layer 750 to complete the manufacturing of the transfer substrate 700.

In the present embodiment, the light-reflecting layer pattern 730 may be formed before the light-to-heat conversion layer 750 is formed.

A method of manufacturing an organic electroluminescent element according to the present embodiment may be provided substantially the same as the method of manufacturing the organic electroluminescent element illustrated in FIGS. 5 to 6D, except that the transfer substrate 700 illustrated in FIG. 9 is used instead of the transfer substrate 100. Thus, any further description is omitted.

Fifth Embodiment

Figure 11:
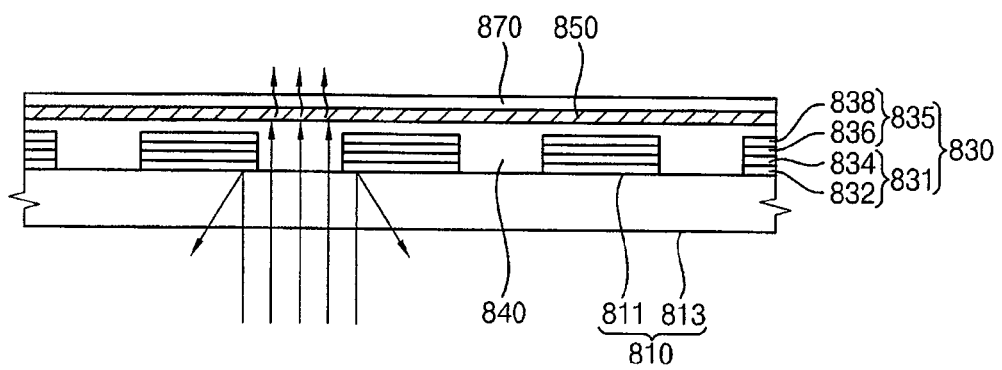
FIG. 11 is a cross-sectional view illustrating a transfer substrate according to a fifth embodiment of the present invention.

FIG. 11 is a cross-sectional view illustrating a transfer substrate according to a fifth embodiment of the present invention.

Referring to FIG. 11, a transfer substrate 800 according to a fifth embodiment of the present invention may be provided substantially the same as the transfer substrate 700 illustrated in FIG. 9, except that a light-reflecting layer pattern 830 and a planarization layer 840 covering the light-reflecting layer pattern 830 are formed on a first face 811 of a base layer 810, and a light-to-heat conversion layer 850 is formed on the planarization layer 840.

Thus, corresponding reference numerals are used to refer to substantially the same elements, and any further description is omitted.

A method of manufacturing the transfer substrate 800 may be provided substantially the same as the method of manufacturing the transfer substrate 700 shown in FIGS. 10A to 10C, except that the light-to-heat conversion layer 850 is formed on the planarization layer 840 after the light-reflecting layer pattern 830 and the planarization layer 840 are formed on the first face 811 of the base layer 810. Thus, any further description is omitted.

A method of manufacturing an organic electroluminescent element according to the present embodiment may be provided substantially the same as the method of manufacturing the organic electroluminescent element illustrated in FIGS. 5 to 6D, except that the transfer substrate 800 illustrated in FIG. 11 is used instead of the transfer substrate 100. Thus, any further description is omitted.

According to the above, a laser irradiation apparatus, an array substrate and a transfer substrate may be easily aligned to reduce processing time, and the scan of laser light may be simple and easy to perform to efficiently manufacture a large-size flat panel display device.

Thus, a transfer substrate, a method of manufacturing the transfer substrate and a method of manufacturing an organic electroluminescent element may be applied to forming a pattern of a flat panel display device such as an organic light emitting display device.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims. The present invention is defined by the following claims, with equivalents of the claims to be included therein.

What is claimed is:

1. A transfer substrate comprising:
a base layer;
a light-reflecting layer pattern disposed on a first face of the base layer, the light-reflecting layer pattern having a plurality of light-transmitting areas and a light-reflecting area defining the light-transmitting areas, the light-reflecting area having reflectivity that is higher than reflectivity of the base layer;
a light-to-heat conversion layer disposed on the first face of the base layer corresponding to the light-transmitting areas; and
a transfer layer formed on the light-to-heat conversion layer.

2. The transfer substrate of claim 1, wherein openings are formed through the light-reflecting layer pattern corresponding to the light-transmitting areas.

3. The transfer substrate of claim 2, wherein the light-to-heat conversion layer is disposed in the openings.

4. The transfer substrate of claim 3, wherein the light-to-heat conversion layer extends to the light-reflecting area, and is formed on the light-reflecting layer pattern.

5. The transfer substrate of claim 3, further comprising a planarization layer formed on the light-reflecting layer pattern and the light-to-heat conversion layer, wherein the transfer layer is formed on the planarization layer.

6. The transfer substrate of claim 2, further comprising a planarization layer that fills the openings formed through the light-reflecting layer pattern and is formed on the light-reflecting layer pattern, wherein the light-to-heat conversion layer is formed on the planarization layer.

7. The transfer substrate of claim 6, wherein the light-reflecting layer pattern comprises a plurality of optical interference layers, each of the optical interference layers comprising:
a first thin film facing the first face of the base layer and having a first optical refractive index; and
a second thin film disposed on the first thin film and having a second optical refractive index smaller than the first optical refractive index.

8. A transfer substrate comprising:
a base layer;
a light-to-heat conversion layer disposed on a first face of the base layer;
a transfer layer formed on the light-to-heat conversion layer; and
a light-reflecting layer pattern disposed on a second face opposite to the first face of the base layer, the light-reflecting layer pattern having a plurality of light-transmitting areas and a light-reflecting area defining the light-transmitting areas.

9. The transfer substrate of claim 8, wherein the light-to-heat conversion layer has a shape corresponding to the light-transmitting areas.

10. The transfer substrate of claim 8, wherein the light-to-heat conversion layer is disposed corresponding to all of the light-transmitting areas and the light-reflecting area.

11. The transfer substrate of claim 8, wherein the light-reflecting layer pattern comprises a plurality of optical interference layers, each of the optical interference layers comprising:
a first thin film facing the second face of the base layer and having a first optical refractive index; and
a second thin film disposed on the first thin film and having a second optical refractive index smaller than the first optical refractive index.

12. The transfer substrate of claim 11, wherein openings are formed through the optical interference layers corresponding to the light-transmitting areas.

13. A method of manufacturing a transfer substrate, the method comprising:
forming a light-reflecting layer pattern having a plurality of light-transmitting areas and a light-reflecting area defining the light-transmitting areas on a first face of a base layer, the light-reflecting area having reflectivity that is higher than reflectivity of the base layer;
forming a light-to-heat conversion layer on the first face of the base layer corresponding to the light-transmitting areas; and
forming a transfer layer on the light-to-heat conversion layer.

14. The method of claim 13, wherein forming the light-reflecting layer pattern comprises:
forming a light-reflecting layer on the first face of the base layer; and
forming openings through the light-reflecting layer corresponding to the light-transmitting areas.

15. The method of claim 14, wherein forming the light-to-heat conversion layer comprises forming the light-to-heat conversion layer in the openings, and wherein the method further comprises forming a planarization layer on the light-to-heat conversion layer prior to forming the transfer layer.

16. The method of claim 14, further comprising forming a planarization layer disposed on the light-reflecting layer pattern and filling the openings formed in the light-reflecting layer pattern, and wherein the light-to-heat conversion layer is formed on the planarization layer.

17. The method of claim 14, wherein forming the light-reflecting layer pattern comprises:
   forming a first thin film facing the first face of the base layer and having a first optical refractive index; and
   forming a second thin film having a second optical refractive index smaller than the first optical refractive index on the first thin film.

18. A method of manufacturing a transfer substrate, the method comprising:
   forming a light-to-heat conversion layer on a first face of a base layer;
   forming a transfer layer on the light-to-heat conversion layer; and
   forming a light-reflecting layer pattern having a plurality of light-transmitting areas and a light-reflecting area defining the light-transmitting areas on a second face opposite to the first face of the base layer.

19. The method of claim 18, further comprising removing a portion of the light-to-heat conversion layer corresponding to the light-reflecting area to form in the light-to-heat conversion layer a pattern corresponding to the light-transmitting areas.

20. The method of claim 18, wherein forming the light-reflecting layer pattern comprises:
   forming a first thin film facing the second face of the base layer and having a first optical refractive index; and
   forming a second thin film having a second optical refractive index smaller than the first optical refractive index on the first thin film.

21. The method of claim 20, further comprising forming an opening through the first thin film and the second thin film corresponding to the light-transmitting area.

22. A method of manufacturing organic electroluminescent element, the method comprising:
   providing an array substrate in which a plurality of first electrodes is exposed;
   providing a transfer substrate, the transfer substrate comprising a light-reflecting layer pattern having a plurality of light-transmitting areas and a light-reflecting area defining the light-transmitting areas, the light-reflecting layer pattern being disposed on a base layer, the light-reflecting area having reflectivity that is higher than reflectivity of the base layer, the transfer substrate further comprising a light-to-heat conversion layer disposed corresponding to the light-transmitting areas, the transfer substrate further comprising a transfer layer formed on the light-to-heat conversion layer;
   disposing the transfer substrate relative to the array substrate so that the light-transmitting areas correspond to the first electrodes;
   irradiating light onto the transfer substrate to transfer portions of the transfer layer onto the first electrodes, the light passing through the base layer, a first portion of the light being incident onto the light-transmitting areas, a second portion of the light being reflected by the light-reflecting area;
   removing the transfer substrate from the array substrate; and
   forming second electrodes on the portions of the transfer layer transferred onto the first electrodes.

23. The method of claim 22, wherein
   the portions of the transfer layer are transferred onto the first electrodes by using a line laser beam extending in a first direction to scan the light-reflecting layer pattern in a second direction crossing the first direction, and
   the portions of the transfer layer overlap the light-to-heat conversion layer without overlapping the light-reflecting area.

24. The method of claim 23, wherein the steps of disposing the transfer substrate relative to the array substrate, irradiating light onto the transfer substrate, and removing the transfer substrate are repeated for each transfer substrate in a set of transfer substrates to deposit a sequence of transfer layers onto first electrodes, wherein
   the sequence of transfer layers includes a first organic emission layer having a first color, a second organic emission layer having a second color, and a third organic emission layer having a third color, portions of the first organic emission layer being transferred onto a first array of the first electrodes, portions of the second organic emission layer being transferred onto a second array of the first electrodes and portions of the third organic emission layer being transferred onto the a third array of the first electrodes.

25. The method of claim 23, further comprising:
   disposing an additional transfer substrate corresponding to a different area of the array substrate;
   moving an irradiation apparatus irradiating the line laser beam over to the additional transfer substrate so as not to deviate from the array substrate; and
   irradiating the line laser beam onto the additional transfer substrate to transfer portions of a transfer layer of the additional transfer substrate onto the first electrodes.

* * * * *